US005774402A

United States Patent [19]
Lee

[11] Patent Number: 5,774,402
[45] Date of Patent: Jun. 30, 1998

[54] INITIALIZATION CIRCUIT FOR A SEMICONDUCTOR MEMORY DEVICE

[75] Inventor: Cheol-Ha Lee, Kyungki-do, Rep. of Korea

[73] Assignee: Samsung Electronics Co., Ltd., Suwon, Rep. of Korea

[21] Appl. No.: 697,356

[22] Filed: Aug. 23, 1996

[30] Foreign Application Priority Data

Aug. 23, 1995 [KR] Rep. of Korea ................... 26181/1995

[51] Int. Cl.$^6$ ....................................................... G11C 7/00
[52] U.S. Cl. ........................................... 365/191; 365/193
[58] Field of Search ..................................... 365/191, 193; 327/143, 198, 217

[56] References Cited

U.S. PATENT DOCUMENTS 4,933,902  6/1990  Yamada et al. ......................... 327/198
4,984,215  1/1991  Ushida ............................... 365/189.11
5,305,271  4/1994  Watanabe ................................ 365/205

Primary Examiner—David C. Nelms
Assistant Examiner—Michael T. Tran
Attorney, Agent, or Firm—Marger, Johnson, McCollom & Stolowitz, PC

[57] ABSTRACT

An initialization circuit for a semiconductor memory device includes an initialization signal generator that generates an initialization signal in response to a specific sequence of reset control signals. A transfer unit activates a reset signal for resetting various circuits on the device in response to either the initialization signal or a conventional power-up initialization signal. Thus, the initialization signal generator provides reliable initialization even if the power-up detection circuit fails. External row and column address strobe signals serve as two reset control signals, while a mode selection signal serves as another reset control signal. The initialization signal is activated when the three reset control signals are activated in the proper sequence, then deactivated when one of the control signals is deactivated.

19 Claims, 4 Drawing Sheets

INITIALIZATION CIRCUIT FOR A SEMICONDUCTOR MEMORY DEVICE

This application corresponds to Korean Patent Application No. 26181/1995 filed Aug. 23, 1995 in the name of Samsung Electronics Co., Ltd., which is herein incorporated by reference.

BACKGROUND OF THE INVENTION

1. Field of the Invention

The present invention relates generally to initialization circuits for semiconductor memory devices and more particularly to initialization circuits which operate in response to an external control signal, thereby providing reliable initialization when conventional power supply reset circuits malfunction.

2. Description of the Related Art

As the density and capacity of semiconductor memory devices increases, their functional circuits become more complicated. Such devices require initialization circuits for resetting the various functional circuits within the chip. These initialization circuits are typically referred to as power on reset circuits and generate a reset signal in response to a power supply voltage VCC being applied to the chip. The typical power on reset circuit operates by sensing the level of the power supply voltage VCC and generating an initialization signal for a predetermined length of time when the power supply voltage reaches a predetermined level.

FIG. 1 is a schematic diagram of a prior art initialization circuit for a semiconductor memory device. The circuit includes a power supply voltage detector 12 for monitoring the state of the power supply voltage VCC and generating a power supply detection signal φVCCH. A back bias voltage generator 14 monitors a back bias voltage VBB and outputs a back bias detection signal φDETB. An initialization signal generator 16 generates an initialization signal φINIT which is activated when the power supply detection signal φVCCH is activated and is deactivated when the back bias detection signal φDETB is activated. The initialization signal generator 16 includes a flip-flop comprised of NAND gates 20 and 22 which are cross coupled. The output terminal of NAND gate 20 is set to a logic high-level by the power supply detection signal and reset to a logic low-level by the back bias detection signal.

FIG. 2 is a timing diagram showing waveforms at various points in the circuit of FIG. 1. When the power supply voltage VCC is first applied to the chip, the power supply voltage detector 12 monitors the voltage level of the power supply VCC which gradually increases from 0 volts to an operating voltage level, e.g. 3 volts. The power supply voltage detector 12 activates the power supply detection signal φVCCH when the power supply voltage reaches its operating level. The signal φVCCH is then deactivated by switching to the logic low-level after a predetermined period of time. The power supply detection signal φVCCH is then applied to the input terminal of an inverter 18 which sets the flip-flop, thereby activating the initialization signal φINIT through inverters 24 and 26. The initialization signal φINIT is maintained in its active high state until the back bias detection signal φDETB is activated by the back bias voltage generator 14, thereby resetting the flip-flop.

The back bias voltage generator 14 operates from the power supply VCC and generates a negative voltage −V after the input power supply voltage VCC is stabilized at its operational level, e.g., about 3 volts. When the negative voltage −V is stabilized, e.g., at approximately −3 volts, the back bias generator 14 generates the back bias detection signal φDETB by driving it to its active low-level, thereby resetting the flip-flop in the initialization generator 16.

A problem with the initialization circuit of FIG. 1 is that it may malfunction if the power supply voltage VCC is unstable input. For example, the rise time of the power supply voltage VCC is typically about 200 microseconds. However, if the power supply voltage level rises very slowly, e.g., over the course of several milliseconds, the power supply voltage detector 12 of FIG. 1 may malfunction, thereby generating an abnormal power supply detection signal φVCCH. Thus, the initialization signal φINIT may be extremely short or may not be generated at all, thereby failing to initialize the circuits within the chip.

SUMMARY OF THE INVENTION

It is therefor an object of the invention to reliably initialize a semiconductor memory device when a power-up reset circuit malfunctions.

A further object of the invention is to initialize a semiconductor memory device in response to external logic signals.

On aspect of the present invention is an initialization circuit for a semiconductor memory device comprising: an initialization signal generator that generates an initialization signal responsive to a plurality of control signals being activated in a predetermined sequence, the initialization signal generator including: a plurality of input terminals for receiving the plurality of control signals, an output terminal for transmitting the initialization signal, and a control clock generator coupled to the plurality of input terminals, the control clock generator generating a control clock signal responsive to the control signals.

Another aspect of the present invention is an initialization circuit for a semiconductor memory device comprising: a first initialization signal generator that generates a first initialization signal responsive to a sequence of control signals; a second initialization signal generator that generates a second initialization signal responsive to a power supply start-up; and a transfer unit coupled to the first and second initialization signal generators, the transfer unit generating a reset signal responsive to the first and second initialization signals.

A further aspect of the present invention is a method for initializing a circuit in a semiconductor memory device comprising: generating a sequence of control signals; activating a first initialization signal responsive to the sequence of control signals; and initializing the circuit responsive to activating the first initialization signal. The method further includes: activating a second initialization signal responsive to a power supply start-up; activating a reset signal responsive to either the second initialization signal or the first initialization signal; and initializing the circuit responsive to the reset signal.

The foregoing and other objects, features and advantages of the invention will become more readily apparent from the following detailed description of a preferred embodiment of the invention which proceeds with reference to the accompanying drawings.

DETAILED DESCRIPTION OF THE PREFERRED EMBODIMENT

Figure 1:
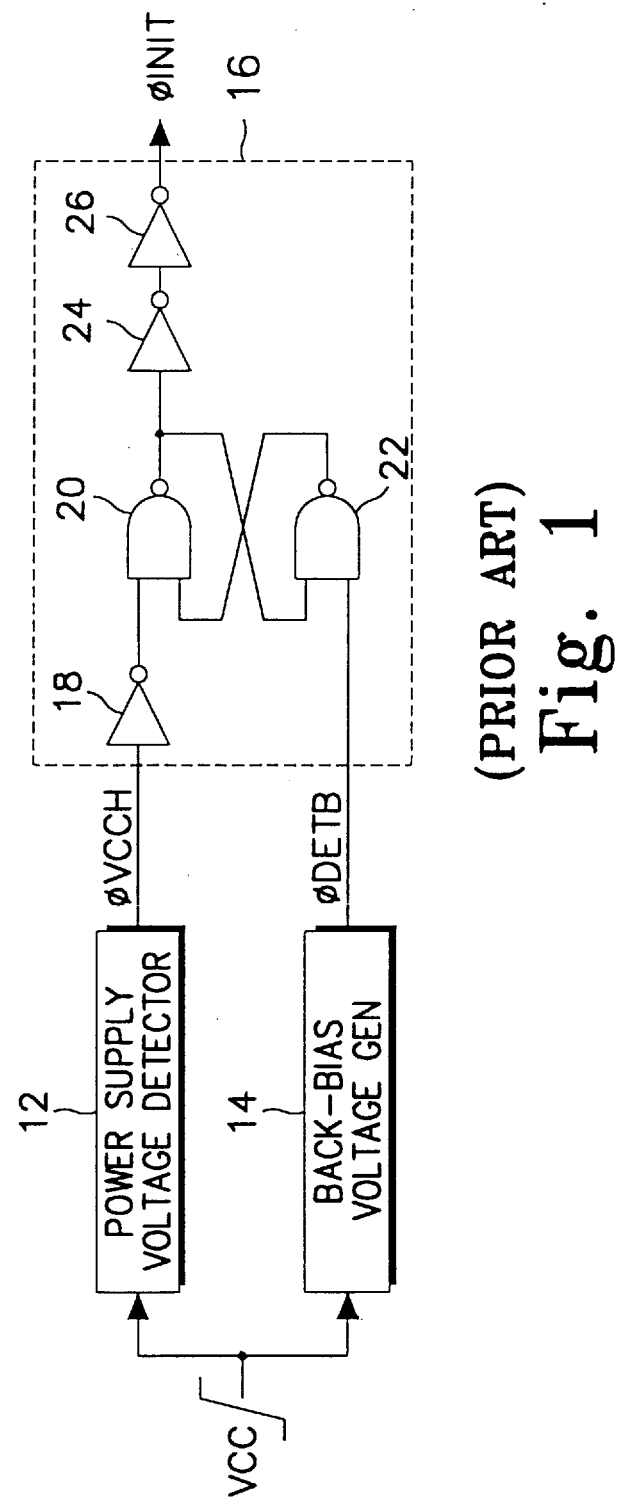
FIG. 1 is a schematic diagram of a prior art initialization circuit for a semiconductor memory device.
Figure 3:
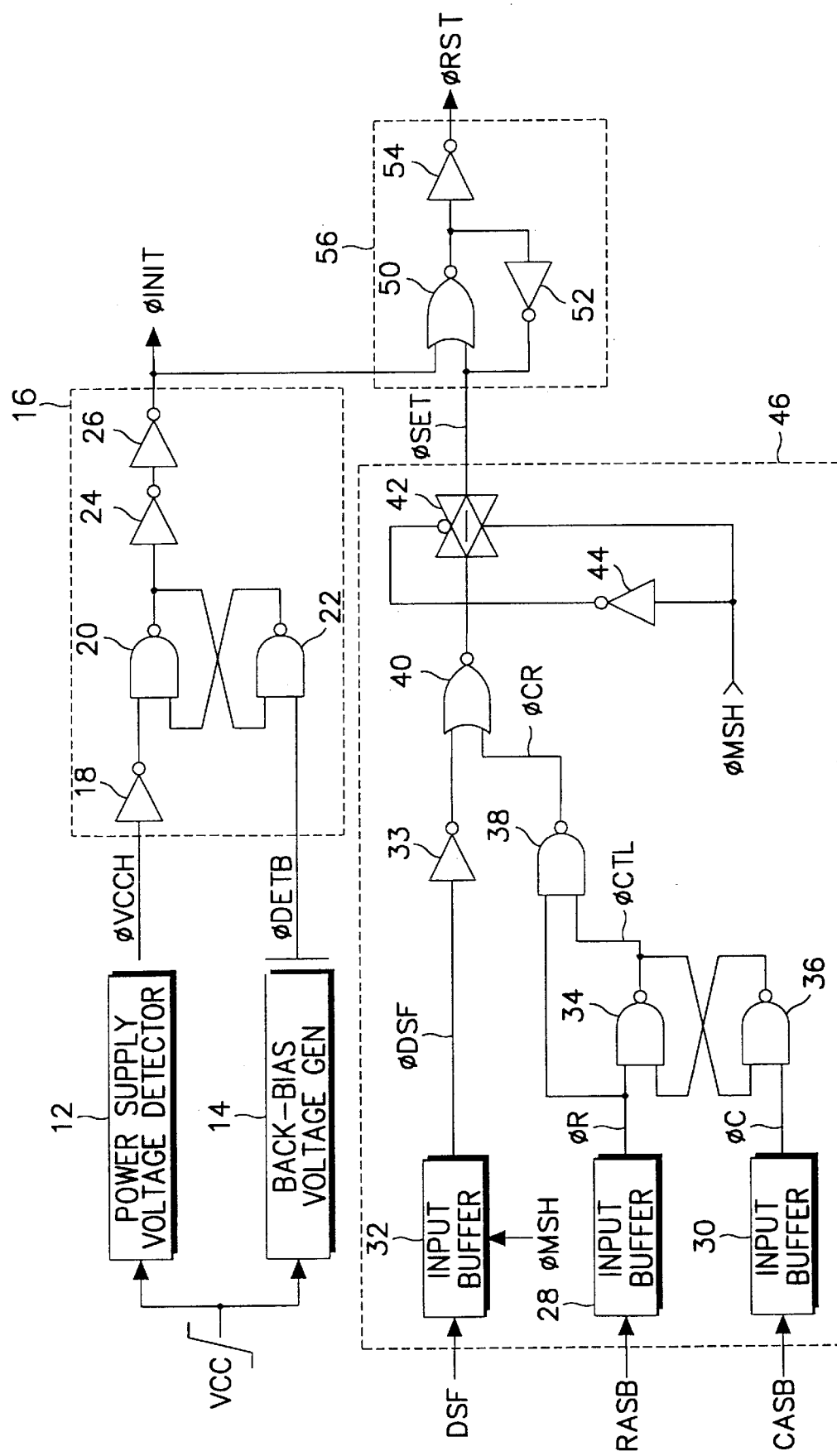
FIG. 3 is a schematic diagram of an embodiment of an initialization circuit in accordance with the present invention.
Figure 4:
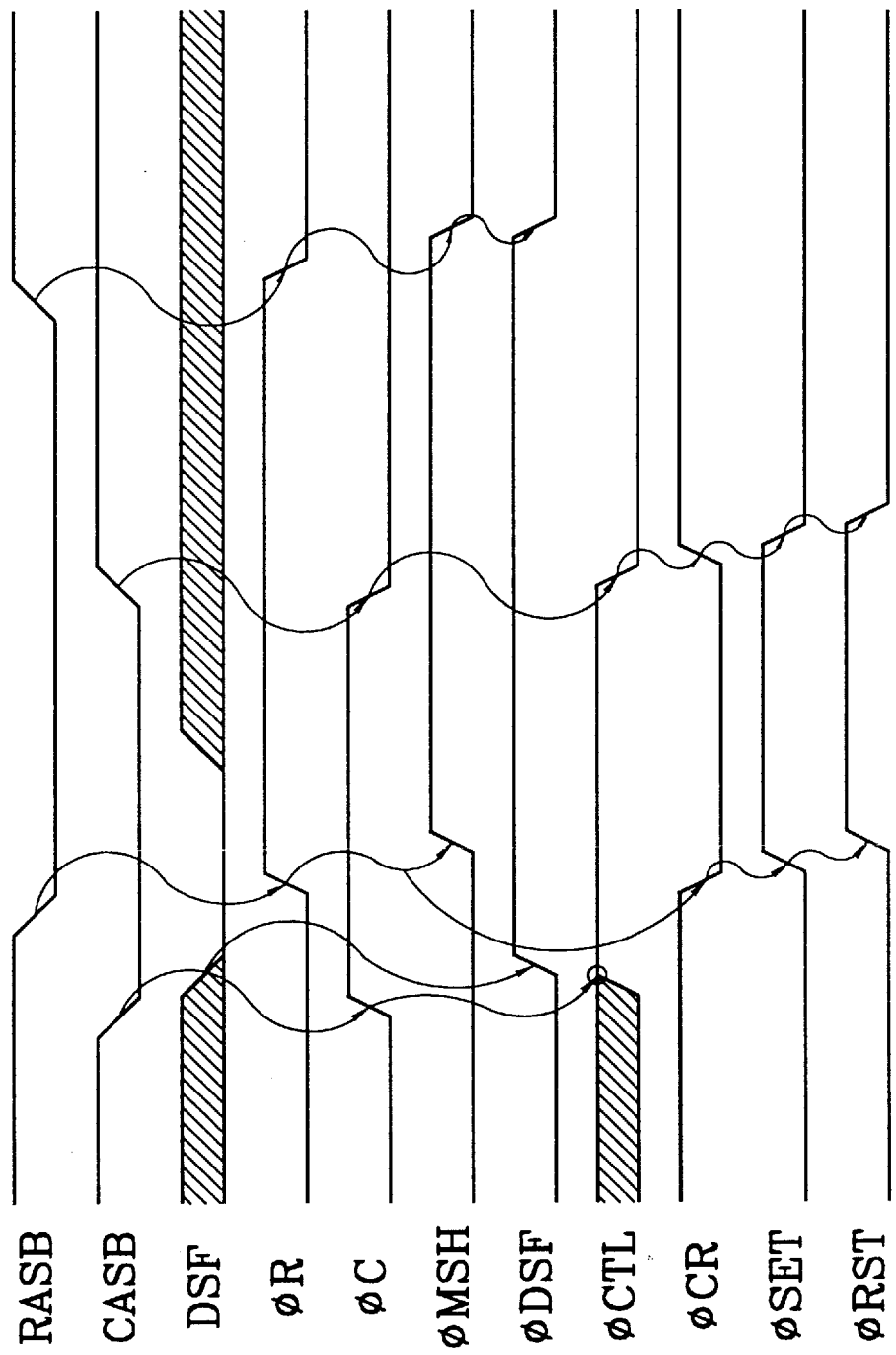
FIG. 4 is a timing diagram showing waveforms of signals at various points within the circuit of FIG. 3.

Referring to FIG. 3, an embodiment of an initialization circuit for a semiconductor memory device in accordance with the present invention includes a first initialization signal generator 46, a second initialization signal generator 16 and a transfer unit 56. The first initialization signal generator generates a first initialization signal φSET in response to a sequence of reset control signals DSF, RASB, and CASB. The second initialization signal generator 16 is essentially the same as the circuit of FIG. 1 and generates a second initialization signal φINIT in response to the power-up of a power supply VCC. The transfer unit 56 generates a reset signal φRST for resetting a circuit within the memory device responsive to the first and second initialization signals.

In operation, the transfer unit 56 activates the reset signal φRST in response to the activation of either the first or second initialization signals φSET or φINIT. If the second initialization signal φINIT is activated, it is latched by the transfer unit 56 and the reset signal φRST remains active until the first initialization signal generator 46 resets the latch by deactivating the first initialization signal φSET by driving it to a low logic level. Thus, the reset signal φRST is activated in response to either the power supply power-up or the reset information. Therefore, if the power-up reset circuit malfunctions, the circuitry will still be properly initialized by the first initialization signal φSET.

More detailed consideration will now be given to the structure of the circuit of FIG. 3. The first initialization signal generator 46 includes a first input buffer 30 which is connected to a first input terminal for receiving a first control signal CASB. Buffer 30 generates a column address clock signal φC in response to CASB. A second input buffer 28 is connected to a second input terminal to receive a second control signal RASB. Buffer 28 generates a row address clock signal φR in response to RASB. The first control signal CASB is typically a column address strobe signal, and the second control signal RASB is typically a row address strobe signal. A third input buffer 32 is connected to a third input terminal and receives a mode selection signal DSF for generating a mode selection clock signal φDSF. Input buffer 32 is also connected to a delay clock signal φMSH which is generated by delaying the row address clock signal φR. The delay clock signal φMSH is used to latch the mode selection clock signal φR.

A control clock generator comprises NAND gates 34 and 36 and generates a control clock signal φCTL responsive to φR and φC. The first NAND gate includes a first input terminal connected to an output terminal of input buffer 28, a second input terminal connected to the output terminal of NAND gate 36, and an output terminal which forms the output terminal of the control clock generator for transmitting the control clock signal φCTL. The second NAND gate 36 includes a first input terminal connected to an output terminal of buffer 30, and a second input terminal connected to the output terminal of NAND gate 34. A third NAND gate 38 has a first input terminal connected to the output terminal of buffer 28, a second input terminal connected to the output terminal of NAND gate 34, and an output terminal for generating a second control clock signal φCR in response to the signals φR and φCTL. A two input NOR gate 40 has a first input terminal connected to the output terminal of NAND gate 38, a second input terminal connected to an output terminal of buffer 32 through an inverter 33, and an output terminal for generating the first initialization signal φSET. A transmission gate 42 is connected between the output terminal of NOR gate 40 and an output terminal of the first initialization signal generator 46. The transfer gate 42 is driven by a delay clock signal φMSH which is connected directly to the non-inverting control terminal of transmission gate 42 and which is also connected to the inverting control terminal through an inverter 44.

The transfer unit 56 includes a two input NOR gate 50 having a first input terminal connected to the output terminal of the first initialization signal generator 46, a second input terminal connected to an output terminal of second initialization signal generator 16, and an output terminal which is connected back to its first input terminal through an inverter 52. An inverter 54 has an input terminal connected to the output terminal of NOR gate 50 and an output terminal which forms the output terminal of the transfer unit 56 for sending the reset signal φRST to a circuit to be initialized within the chip.

Figure 2:
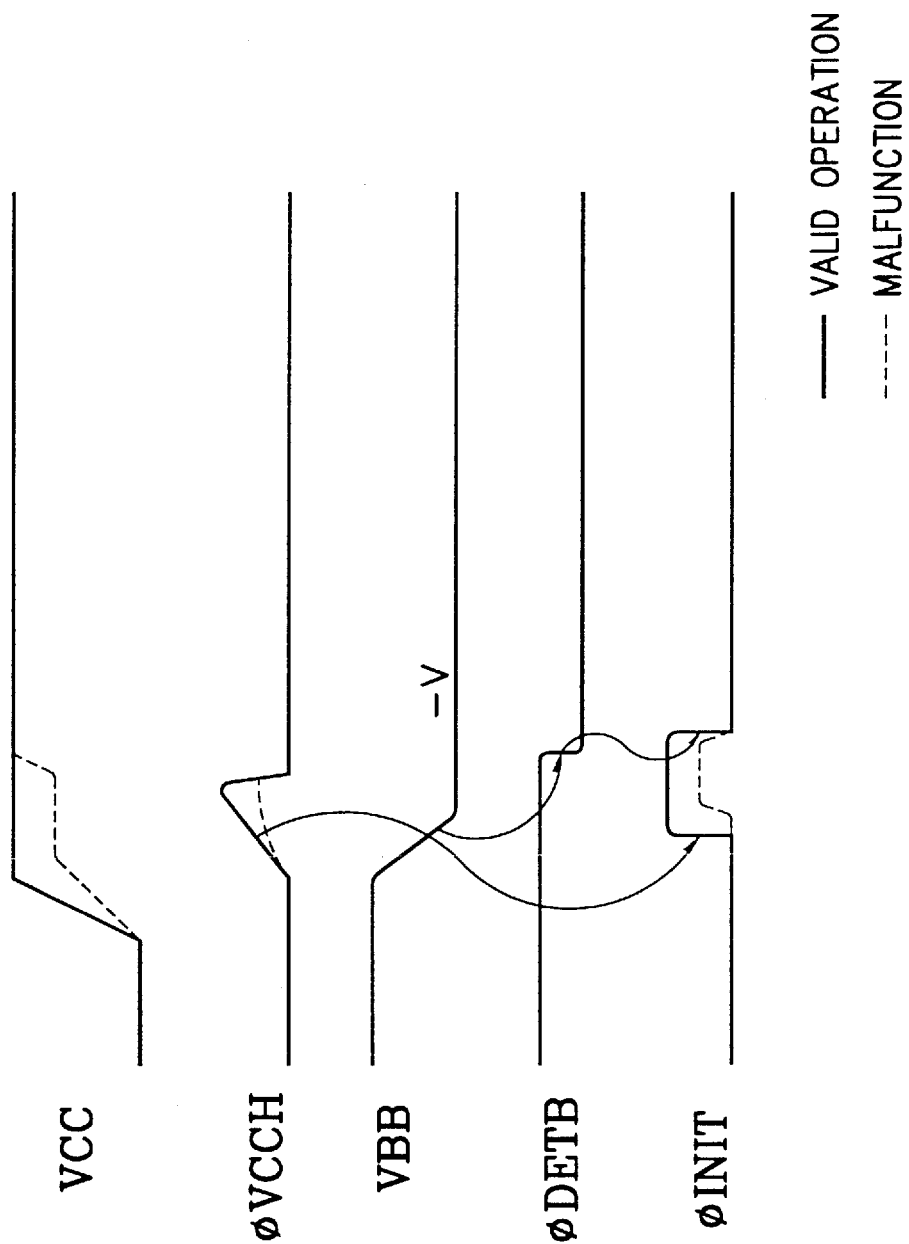
FIG. 2 is a timing diagram showing waveforms of signals at various points within the circuit of FIG. 1.

More detailed consideration will now be given to the operation of the embodiment of the present invention shown in FIG. 3. When the power supply VCC is first powered-up, the second initialization signal generator 16 activates the second initialization signal φINIT as shown in FIG. 2, thus driving the second input terminal of NOR gate 50 to a high-logic level. At this time, the first input terminal of NOR gate 50 which receives the signal φSET is at a low logic level. The transfer unit 56 activates the reset signal φRST in response to the second initialization signal φINIT and latches the second initialization signal. Thus, all circuits within the chip which are connected to the output terminal of transfer unit 56 is held in the initialized state.

In the meantime, if the reset signals DSF, RASB and CASB generate a predetermined bit pattern in the proper sequence, the first initialization signal generator activates the first initialization signal φSET. For this to occur, the reset control signals DSF, RASB, and CASB must be activated in the CBR (CAS before RAS) mode. The mode selection clock signal φDSF is first activated, i.e., driven to a high-logic level. The mode selection clock signal φDSF is latchated in the high state by the delay clock signal φMSH which is generated by delaying the the row address clock signal φR. If the first control signal CASB is then activated by being driven to a low logic state, the control clock signal φCTL is driven to the active high logic level. Then, if the second control signal RASB is driven to the active low logic level, the signal φR activates the second control clock signal φCR through NAND gate 38. NOR gate 40 then combines the signals φCR and φDSF to generate the first initialization signal φSET at the output terminal of NOR gate 40. Transmission gate 42 then transmits the signal φSET from NOR gate 40 to the input terminal of NOR gate 50 in response to the activation of the delay signal φMSH.

The transfer unit 56 combines the first initialization signal φSET and the second initialization signal φINIT and activates the reset signal φRST by driving it to a high logic level, thereby initializing the circuits within the chip. The reset signal φRST remains at the logic high-level until the first control signal CASB is deactivated and driven to the logic high-level. When the signal CASB switches to the high-level, the column address clock φC switches to a logic low-level, thereby driving the control clock φCTL to the low-logic level. Therefore, if signal CASB switches to the high logic level while the second control signal RASB is in the active low state, the first initialization signal φSET is deactivated, which in turn, deactivates the reset signal φRST.

As explained above, an initialization circuit according to the present invention generates a reset signal in response to either a power supply power-up or a sequence of reset signals. Thus, the present invention can properly reset circuits in the chip even when the power-up reset circuit malfunctions.

In the embodiment of FIG. 3, the first and second initialization signals are supplied to individual circuits via one transfer unit. However, the improved reset operation of the present invention can also be obtained with an embodiment, which independently couples the two initialization signals to the various circuits to be reset.

Having described and illustrated the principals of the invention in a preferred embodiment thereof, it should be apparent that the invention can be modified in arrangement and detail without departing from such principals. We claim all modifications and variations coming within the spirit and scope of the following claims.

I claim:

1. An initialization circuit for a semiconductor memory device comprising:
    an initialization signal generator that generates an initialization signal responsive to a plurality of control signals including a row address signal and a column address signal wherein the initialization signal generator activates the initialization signal only when the column address signal is activated before the row address signal, the initialization signal generator including:
        a plurality of input terminals for receiving the plurality of control signals;
        an output terminal for transmitting the initialization signal; and
        a control clock generator coupled to the plurality of input terminals, the control clock generator generating a control clock signal responsive to the control signals.

2. An initialization circuit for a semiconductor memory device comprising:
    an initialization signal generator that genrates an initialization signal responsive to a plurality of control signals being activated in a predetermined sequence, the initialization signal generator including:
        a plurality of input terminals for receiving the plurality of control signals;
        an output terminal for transmitting the initialization signal; and
        a control clock generator coupled to the plurality of input terminals, the control clock generator generating a control clock signal responsive to the control signals;
    wherein;
    the plurality of input terminals includes a first input terminal for receiving a first control signal, a second input terminal for receiving a second control signal, and a third input terminal for receiving a third control signal;
    the control clock generator includes a latch coupled to the first and second input terminals, the latch generating the control clock signal responsive to the first and second control signals; and
    the initialization signal generator includes a logic gate coupled to the latch and the third input terminal for generating the initialization signal responsive to the control clock signal and the third control signal.

3. An initialization circuit according to claim 2 wherein the latch includes:
    a first NAND gate having a first input terminal coupled to the second input terminal of the initialization signal generator, a second input terminal, and an output terminal for generating the control clock signal; and
    a second NAND gate having a first input terminal coupled to the first input terminal of the initialization signal generator, a second input terminal coupled to the output terminal of the first NAND gate, and an output terminal coupled to the second input terminal of the first NAND gate.

4. An initialization circuit according to claim 3 wherein the initialization signal generator further includes a third NAND gate having a first input terminal coupled to the first input terminal of the first NAND gate, a second input terminal coupled to the output terminal of the first NAND gate, and an output terminal for generating a second control clock signal.

5. An initialization circuit according to claim 4 wherein the logic gate is a NOR gate having a first input terminal coupled to the output terminal of the third NAND gate, a second input terminal coupled to the third input terminal of the initialization signal generator, and an output terminal for generating the initialization signal.

6. An initialization circuit according to claim 5 wherein the initialization signal generator further includes an inverter having an input terminal coupled to the third input terminal of the initialization signal generator and an output terminal coupled to the first input terminal of the NOR gate.

7. An initialization circuit according to claim 2 wherein the initialization signal generator includes:
    a first input buffer coupled between the first input terminal of the initialization signal generator and the latch;
    a second input buffer coupled between the second input terminal of the initialization signal generator and the latch; and
    a third input buffer coupled between the third input terminal of the initialization signal generator and the logic gate.

8. An initialization circuit according to claim 2 wherein the initialization signal generator further includes a transmission gate having a controlled current path coupled between the output terminal of the logic gate and the output terminal of the initialization signal generator and a control terminal for receiving a mode selection clock signal.

9. An initialization circuit according to claim 8 wherein:
    the transmission gate further includes a second control terminal; and
    the initialization signal generator further includes a second inverter having an output terminal coupled to the second control terminal of the transmission gate and an input terminal for receiving the mode selection signal.

10. An initialization circuit for a semiconductor memory device comprising:
    a first initialization signal generator that generates a first initialization signal responsive to a sequence of control signals;
    a second initialization signal generator that generates a second initialization signal responsive to a power supply start-up; and
    a transfer unit coupled to the first and second initialization signal generators, the transfer unit generating a reset signal responsive to the first and second initialization signals.

11. An initialization circuit according to claim 10 wherein the transfer unit includes a latch that activates the reset signal responsive to the activation of either the first or second initialization signals and deactivates the reset signal responsive to the deactivation of the first initialization signal.

12. An initialization circuit according to claim 11 wherein the latch includes:
   a NOR gate having a first input terminal for receiving the first initialization signal, a second input terminal for receiving the second initialization signal, and an output terminal; and
   an inverter having an input terminal coupled to the output terminal of the NOR gate and an output terminal coupled to the first input terminal of the NOR gate.

13. An initialization circuit according to claim 12 wherein the transfer unit further includes an inverter having an input terminal coupled to the output terminal of the NOR gate and an output terminal for transmitting the reset signal.

14. A method for initializing a circuit in a semiconductor memory device comprising:
   generating a sequence of control signals including a column address signal and a row address signal;
   activating a first initialization signal responsive to the sequence of control signals only when the column address signal is activated before the row address signal; and
   initializng the circuit responsive to activating the first initialization signal.

15. A method according to claim 14 wherein generating the sequence of control signals further includes activating a mode selection signal.

16. A method for initializing a circuit in a semiconductor memory device comprising:
   generating a sequence of control signals including activating a first control signal and activating a second control signal;
   activating a first initialization signal responsive to the sequence of control signals;
   initializing the circuit responsive to activating the first initialization signal;
   deactivating the first control signal; and
   deactivating the first initialization signal responsive to deactivating the first control signal.

17. A method for initializing a circuit in a semiconductor memory device comprising:
   generating a sequence of control signals;
   activating a first initialization signal responsive to the sequence of control signals;
   initializing the circuit responsive to activating the first initialization signal;
   activating a second initialization signal responsive to a power supply start-up;
   activating a reset signal responsive to either the second initialization signal or the first initialization signal; and
   initializing the circuit responsive to the reset signal.

18. A method according to claim 16 further including:
   activating a second initialization signal responsive to a power supply start-up;
   latching the second initialization signal;
   activating a reset signal responsive to latching the second initialization signal; and
   deactivating the reset signal responsive to deactivating the first initialization signal.

19. A method for initializing a circuit in a semiconductor memory device comprising:
   generating a sequence of control signals;
   activating a first initialization signal responsive to the sequence of control signals;
   initializing the circuit responsive to activating the first initialization signal;
   wherein the semiconductor memory device further includes a second circuit to be initialized, and wherein the method further includes:
   activating a second initialization signal responsive to a power supply start-up;
   initializing the circuit responsive to activating the second initialization signal; and
   initializing the second circuit responsive to activating the first initialization signal.

* * * * *